(12) United States Patent
Yang et al.

(10) Patent No.: US 7,315,446 B2
(45) Date of Patent: Jan. 1, 2008

(54) HARD DRIVE CONNECTING DEVICE FOR NOTEBOOK COMPUTER

(75) Inventors: Yung-Chi Yang, Taipei (TW); You-Fa Luo, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/269,977

(22) Filed: Nov. 8, 2005

(65) Prior Publication Data
US 2007/0008694 A1    Jan. 11, 2007

(30) Foreign Application Priority Data
Jul. 11, 2005    (TW) ............................. 94211714 U (51) Int. Cl.
*G06F 1/16* (2006.01)

(52) U.S. Cl. ............ 361/685; 360/97.01; 257/E23.083; 73/514.31

(58) Field of Classification Search ............ 360/97.01, 360/266 C; 257/E23.083; 439/67, 77; 361/679–687, 361/724–727; 73/514.31
See application file for complete search history.

(56) References Cited

U.S. PATENT DOCUMENTS 5,299,089 A * 3/1994 Lwee ......................... 361/684
5,504,636 A * 4/1996 Yuki et al. ................ 360/97.01
5,995,365 A * 11/1999 Broder et al. ............... 361/685
6,626,687 B2 * 9/2003 Homer et al. ............... 439/151

FOREIGN PATENT DOCUMENTS

TW          426177      2/1988
TW          584223      7/1996

* cited by examiner

*Primary Examiner*—Hung Van Duong
(74) *Attorney, Agent, or Firm*—Peter F. Corless; Steven M. Jensen; Edwards Angell Palmer & Dodge LLP (57) ABSTRACT

A hard drive connecting device for a notebook PC is installed in a case of the notebook PC for connecting a main board and a hard drive in the case, which includes a flexible board having at least a first side, at least a second side, and conductive lines for electrically connecting the first side to the second side; a first connector located in the hard drive bay electrically connected to the first side for electrically connecting the hard drive; and a second connector electrically connected to the second side for electrically connecting the main board. The flexible board facilitates electrical connection of the hard drive that allows reduction of both the size of the hard drive and the installation space required for the hard drive, thus facilitating profile miniaturization of notebook PCs.

18 Claims, 6 Drawing Sheets

HARD DRIVE CONNECTING DEVICE FOR NOTEBOOK COMPUTER

FIELD OF THE INVENTION

The present invention relates to connecting devices for notebook computers, and more particularly, to a hard drive connecting device for a notebook computer.

BACKGROUND OF THE INVENTION

Any improvements made to the structure of computer hardware that facilitate miniaturization, profile-slimming, simplified structure, portability, or reduction of cost is highly valuable for the industry. In view of this, the present invention is directed at realizing all of these benefits in the design of a hard drive connecting device for a notebook computer.

The structure of a conventional notebook computer primarily consists of a main board, hard drive, and battery installed inside of a case, wherein the connection of the hard drive and the main board is generally established by fixing a hard drive connecting device provided on the main board to one side of the preset hard drive bay of the case, whereby the hard drive connecting device connects with the hard drive to provide electrical connection therebetween. Related techniques of connecting a hard drive with a notebook PC has been disclosed in Taiwan Utility Patent No. 426177 and 584223 with details described below.

Figure 1:
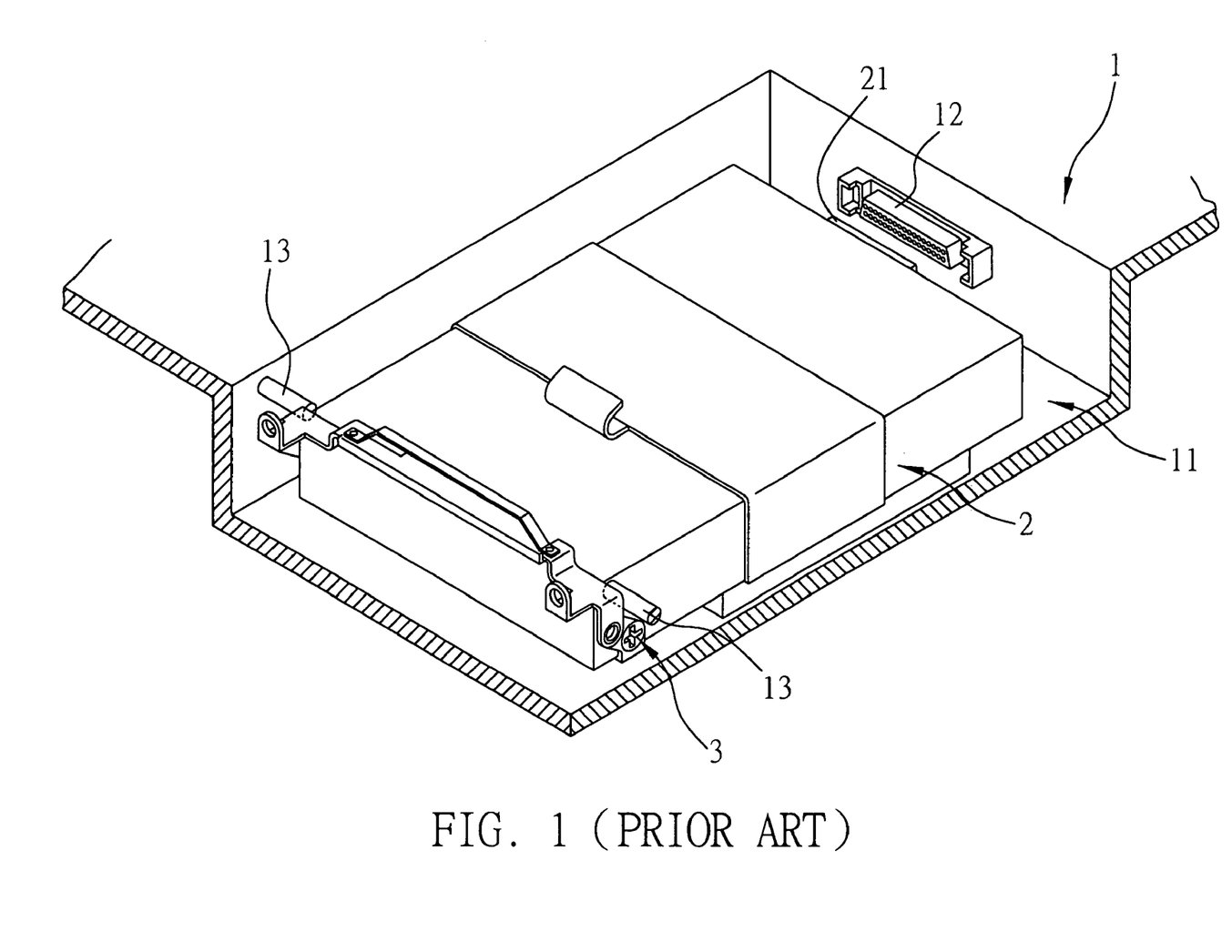
FIG. 1 (PRIOR ART) is a partial schematic diagram showing the installation of the hard drive of a conventional notebook PC.
Figure 2:
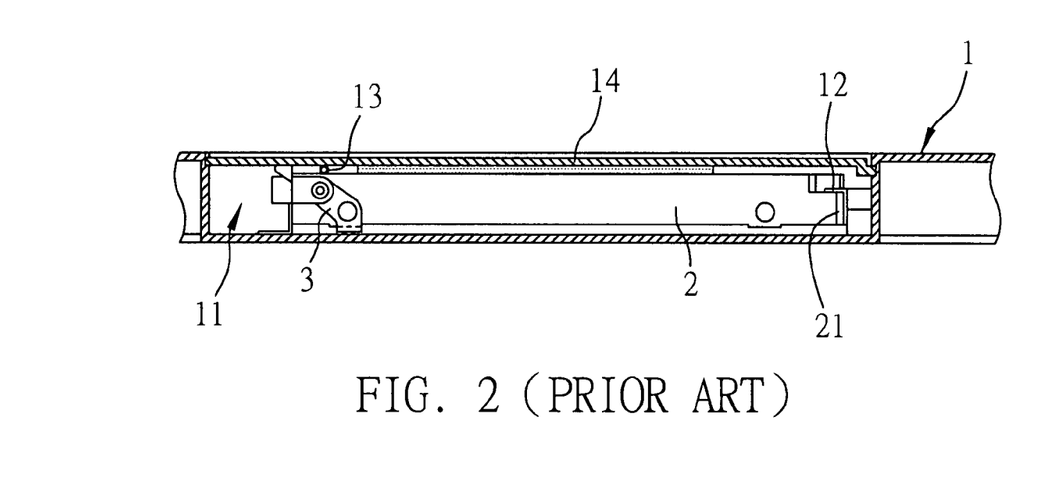
FIG. 2 (PRIOR ART) is a schematic diagram showing the connecting status of the hard drive of a conventional notebook PC.

FIGS. 1 and 2 depict a case of a conventional notebook PC 1 provided with a preset hard drive bay 11 for installing a hard drive 2 therein, wherein one side of the hard drive bay 11 is disposed with a hard drive connecting device 12 for connecting to a main board (not shown), said hard drive 2 being electrically connected to said hard drive connecting device 12 by a connecting head 21, and is further coupled with a lid body 14 to enclose said hard drive bay 11 and secure said hard drive.

Figure 3:
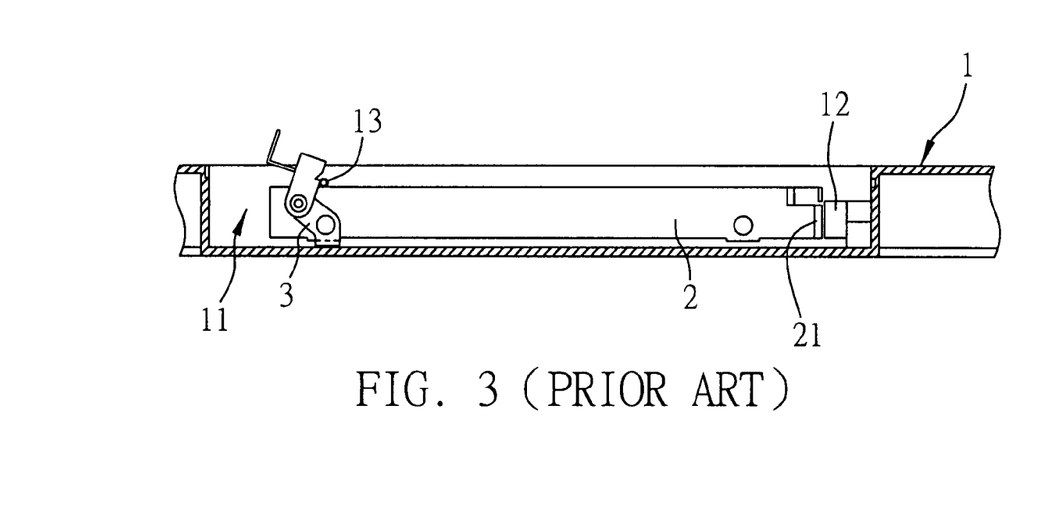
FIG. 3 (PRIOR ART) is a schematic diagram showing a status of pulling out the hard drive of a conventional notebook PC.

Accordingly, the hard drive 2 installed in the hard drive bay 11 requires manual forward and backward movements to plug/pull the connecting head 21 in/out of said hard drive connecting device 12. Since the limited space of the hard drive bay 11 affects the convenience of manual operation by human fingers, it is necessary to additionally install a fastening mechanism 3 that connects to the rear side of the hard drive 2, and also a protruding body 13 correspondingly positioned at both sides of the fastening mechanism 3 in the hard drive bay 11, such that the hard drive 2 can be detached from the hard drive connecting device using the fastening mechanism 3 as shown in FIG. 3.

As can be seen from the hard drive connecting technique disclosed above for a notebook PC, the space of said hard drive bay 11 has to be made relatively larger than the actual volume of the hard drive 2 in order to accommodate the space required for installing the fastening mechanism 3 and the protruding body 13, as well as the operational space required for manually moving forward and backward to accomplish the connection and disconnection. However, such a design not only occupies much space in the case 1, but it also further limits circuit configuration of the internal main board, posing an obstacle to the further miniaturization of notebook PCs.

Moreover, the disposal of the hard drive 2 in the hard drive bay 11 necessitates the forward and backward movements to push in and pull out of the hard drive bay 11, which easily causes distortion of the hard drive connecting device 12 or even detachment from the side of the hard drive bay 11 or the main board due to the force exerted, resulting in electrical disconnection between the hard drive 2 and the main board that seriously affects the reliability of the notebook PC.

Therefore, there is a need for developing an improved hard drive connecting device for a notebook computer that can overcome the drawbacks of prior art techniques as mentioned above.

SUMMARY OF THE INVENTION

In view of the forging and other drawbacks, an objective of the present invention is to provide a novel connecting device for connecting a hard drive of a notebook PC that can save space.

Another objective of the present invention is to provide a novel connecting device for connecting a hard drive of a notebook PC that facilitates miniaturization of notebook computers.

Another objective of the present invention is to provide a novel connecting device for connecting a hard drive of a notebook PC that is capable of preventing the connecting device from distortion—or even electrical breakage caused by detachment—due to forces exerted, thereby enhancing reliability of the notebook PC.

According to the foregoing and other objectives, the present invention proposes a novel hard drive connecting device applicable in a notebook PC that is adapted to install in a case of the notebook PC for connecting a main board and the hard drive in a hard drive bay in the case. The hard drive connecting device comprises: a flexible board having at least a first side, at least a second side, and conductive lines for electrically connecting the first side to the second side; a first connector located in the hard drive bay electrically connected to the first side for electrically connecting the hard drive; and a second connector electrically connected to the second side for electrically connecting the main board.

The case of the notebook PC can comprise a lid body for enclosing the hard drive bay to secure said hard drive therein. Additionally, the exterior of the hard drive may be covered by a protective body such as a rubber cushion to protect the hard drive.

The flexible board is a flexible printed circuit (FPC). The first side and the second side are two adjacent sides of the flexible board, making said first connector and said second connector at a 90-degree angle with respect to each other, whereby the flexible board is further enhanced to proceed with multidirectional rotation and adjustment.

The flexible board can further include an extension located between said first side and said second side for allowing a portion of the first side and the first connector to be overturned to the exterior of the hard drive bay, thereby facilitating electrical connection between the first connector and the hard drive.

Additionally, said flexible board can further include a positioning portion so that it can be partially positioned inside of the case. Preferably, the positioning portion comprises two positioning openings.

In summary, the hard drive connecting device according to the invention is characterized by the combination of a flexible board and two connectors to provide connection of the main board of a notebook PC and the hard drive thereof. By using the flexibility of a flexible board, the first connector located in the hard drive bay can be desirably adjusted to appropriate angles or even overturned to the exterior of the hard drive bay, thereby facilitating easy manual connection of the hard drive before the hard drive is placed into the hard drive bay. Accordingly, it is not necessary to reserve space in the hard drive bay for installing any auxiliary mechanisms or for movement of the hard drive forward and backward to push in and pull out the hard drive. This allows the size of the hard drive bay of the case to be effectively reduced to that of the hard drive, which in turn enables the installation space of the hard drive of a notebook PC to be desirably reduced to meet the demands of profile miniaturization of the notebook PC. Further, since manual operation of electrically connecting the first connector and the hard drive can be freely adjusted and turned to appropriate angles without being affected by the hard drive and the hard drive bay, electrical breakage as occurred in prior art caused by detachment or distortion of the hard drive connecting device due to force exerted is thereby prevented, increasing the reliability of the notebook PC.

Accordingly, the hard drive connecting device according to the invention not only improves over the prior art technique, but also include the foregoing substantial advantages that are highly valuable for the industry.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The present invention is related to a hard drive connecting device for a notebook PC; the following description is thus substantially based on the design of the hard drive connecting device of the invention, other configurations and structures related to the structure of a notebook PC, and the casing design for installing devices other than the hard drive being purposely omitted herein for brevity and clarity.

Figure 4:
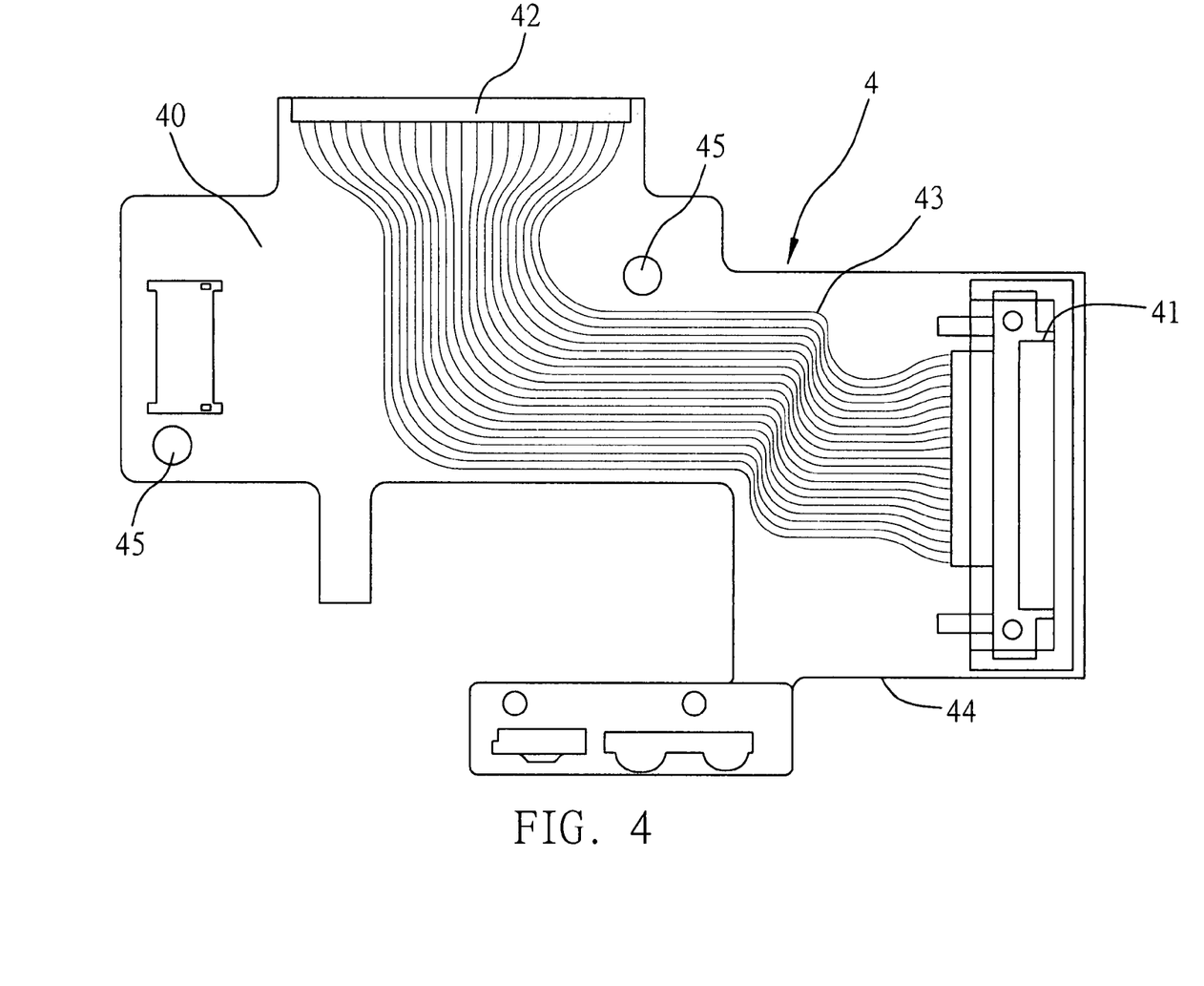
FIG. 4 is a schematic diagram showing the hard drive connecting device according to the present invention.

FIG. 4 illustrates a hard drive connecting device according to the invention. As shown, the hard drive connecting device 4 comprises a flexible board 40, one or more first connectors 41, and a second connector 42. As the hard drive connecting device 4 of the invention is basically applied to being installed inside of the case of a notebook PC, the detailed description involves practically the connection established between the main board and the hard drive in the case of a notebook PC. Note that the hard drive connecting device 4 of the invention can also include other connecting mediums or configurations to integrate other electronic elements of the main board or connect with other external devices. While details of its extended applications are purposely omitted from the preferred embodiment of the invention for the purpose of brevity, the potential of other extended applications derived from and provided by the present invention can be easily implemented by persons skilled in the art and are not limited to those disclosed in the invention.

The flexible board 40 can be, for example, a flexible printed circuit (FPC), the surface thereof being printed to form necessary conductive lines 43 such as traces, in which at least two positioning openings 45 may be formed thereon to constitute a positioning portion for positioning purposes, such that the flexible board 40 may be positioned in the case by retaining posts or screws. At least two ends of the conductive lines 43 are electrically connected to a first side and a second side of the flexible board 40, said first side and said second side can be two sides of the flexible board 40, and, preferably, said two sides are adjacent to each other. Further, the portion of the flexible board 40 between the first side and the second side can further include an extension 44 which is especially closer to the first side, thereby allowing a portion of the first side to be freely turned or adjusted to desirable angles.

The first connector 41 and the second connector 42 are respectively installed on the first side and the second side of said flexible board 40 and electrically connected to two ends of the conductive lines 43, thereby allowing the first connector 41 and the second connector 42 to electrically connect each other via the conductive lines 43. The first connector 41 is adapted to electrically connect the hard drive and, therefore, is, for example, a hard drive connector compliant with the hard drive connecting medium; on the other hand, the second connector 42 is adapted to electrically connect the main board and is, for example, a bus connector compliant with the main board connecting medium.

Figure 5:
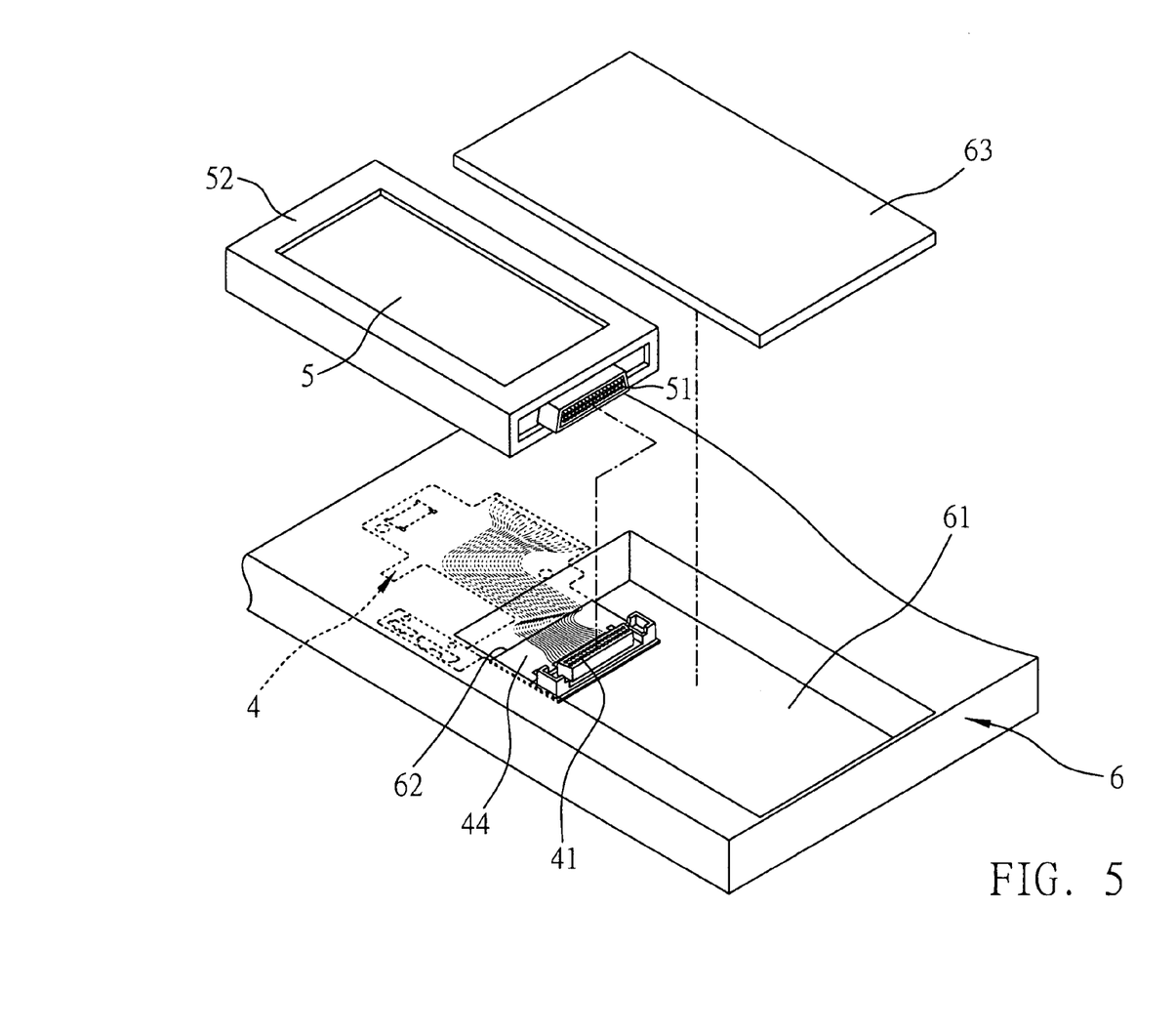
FIG. 5 is a schematic diagram showing the status of installing the hard drive connecting device of the invention in a notebook PC.

Referring to FIG. 5, the hard drive connecting device 4 of the invention is adapted to install inside of the case 6 of a notebook PC for connecting a main board (not shown) in the case 6 and a hard drive 5 in the hard drive bay 61. The first connector 41 of the hard drive connecting device 4 and the extension 44 thereof are located in the hard drive bay 61, such that a portion of the extension 44 (a portion of the first side) and the first connector 41 can be freely turned and adjusted to desired angles, or can be overturned to exterior of the hard drive bay 61.

For allowing the extension 44 and the first connector 41 to be extended in the hard drive bay 61, an opening 62 is preset on a side of the hard drive bay 61 towards the hard drive connecting device 4, and the size of the opening 62 can be the same as the extension 44. The case 6 of the notebook PC further includes a lid body 63 for enclosing the hard drive bay 61 and securing the hard drive therein. Moreover, the exterior of the hard drive 5 installed can be covered by a protective body 52, such as a rubber cushion for protecting the hard drive 5.

The hard drive connecting device 4 of the invention is characterized by disposing the first connector 41 in the hard drive bay 61 of the case 6 and enabling the first connector 41 in the hard drive bay 61 to be freely adjusted to suitable angles or even overturned to the outside of the hard drive bay 61 via the flexibility of the flexible board 40, thereby allowing the hard drive 5 to be easily connected to the adjustable first connector 41 before being placed into the hard drive bay.

Figure 6A:
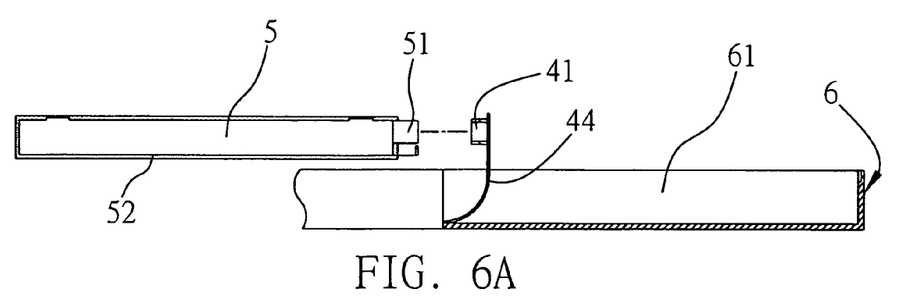
FIGS. 6A and 6B are schematic diagrams showing two different states in which the hard drive connecting device of the invention is connected to the hard drive of a notebook PC.
Figure 7:
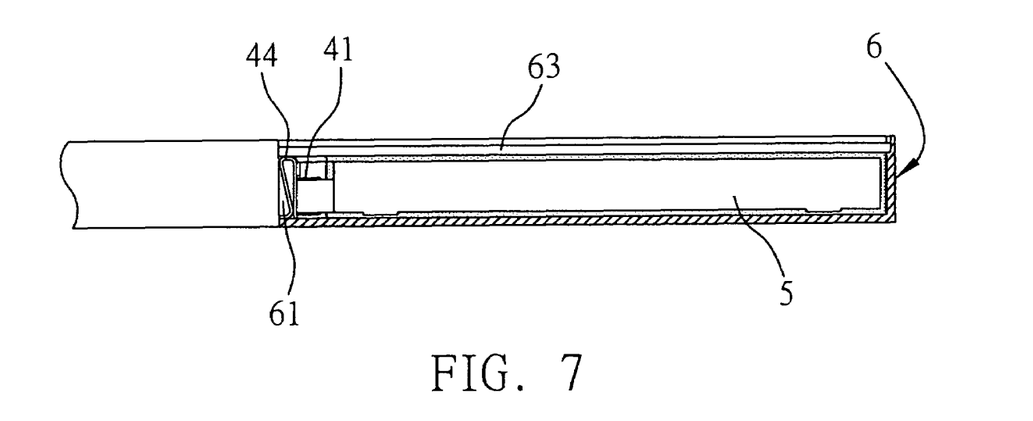
FIG. 7 is a schematic diagram showing the hard drive connecting device of the invention connected with the hard drive of a notebook PC.

As shown in FIG. 6A, the extension 44 can be overturned such that the first connector 41 is protruding outside of the hard drive bay 61 for the convenience of pushing-in and pulling-out of the hard drive 5. The hard drive 5 is first connected with the first connector 41 via theist own connector 51 and then placed into the hard drive bay 61. Lastly, as shown in FIG. 7, the installation of the hard drive 5 in the case 6 is completed by covering the lid body 63 thereon. Similarly, the hard drive 5 can be overturned to the outside of the hard drive bay 61 to be pulled out, and it is easy to detach the connector 51 from the first connector 41 since the exterior of the hard drive bay 61 is free of space limitation.

Figure 6B:
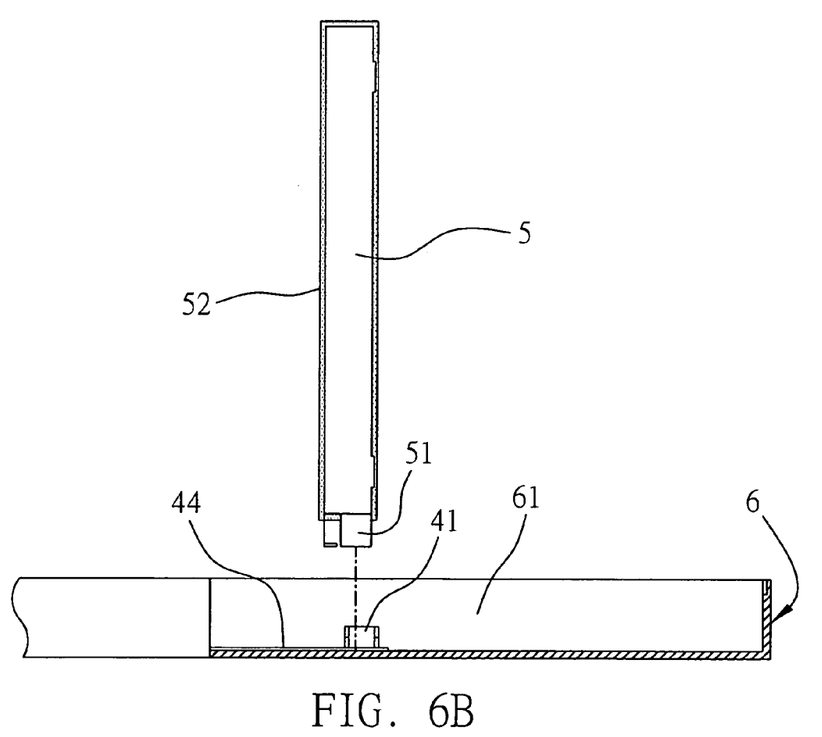

Alternatively, as shown in FIG. 6B, the first connector 41 does not need to be turned over in order to manually connect the hard drive 5 but can directly connect the hard drive 5 in a downward and vertical direction via the adapter 51. The hard drive 5 can then be maneuvered into a final installed position within the hard drive bay 61. Lastly, as shown in FIG. 7, the installation of the hard drive 5 in the case 6 is completed by covering the lid body 63 thereon. In other words, the bottom surface of the hard drive bay 61 can be used as an force exertion point during attachment of the connector 51 to the first connector 41, while during detachment, the hard drive 5 is preferably first overturned to the outside of the hard drive bay 61 in the same manner as described before.

In the disclosed preferred embodiment, the hard drive connecting device 4 is described incorporating with the extension 44, therefore, after the hard drive connecting device 4 is connected with the hard drive 5, the extension 44 can be turned and folded so as to be sandwiched between the side of the hard drive bay 61 and the hard drive 5, thereby substantially shortening the length of the hard drive bay 61. Note that the hard drive connecting device 4 is not limited to the provision of the extension 44, as the flexible board 40 provided possesses the flexibility to enable a certain degree of adjustment, the first connector 41 does not necessarily have to protrude out of the hard drive bay 61 but as long as it extends into the hard drive bay 61.

Summarizing the above, the hard drive connecting device 4 of the invention is characterized by the combination of a flexible board with two connectors to provide connection between the main board of a notebook PC and the hard drive, and also the flexibility of the flexible board can enable a first connector in the hard drive bay to be suitably adjusted or even overturned to the outside of the hard drive bay, thereby facilitating the manual operation of attaching/detaching the hard drive to/from the first connector before being placed into the hard drive bay. Accordingly, there is no need to reserve space in the hard drive bay for installation of auxiliary mechanisms or for maneuvering room to push or pull connectors in and out the hard drive, thus allowing the size of the hard drive bay of the case to be effectively reduced to substantially that of the hard drive, such that the space for installing the hard drive in a notebook PC can be reduced to meet the demand for profile-miniaturization of the notebook PC. Further, the manual operation of electrically connecting the first connector and the hard drive can be freely adjusted and turned to appropriate angles without being affected by the hard drive and the hard drive bay, thereby effectively preventing electrical breakage caused by distortion of the hard drive connecting device due to force exerted, a phenomenon that occurs in the prior art, thus increasing the reliability of the notebook PC.

Accordingly, the hard drive connecting device according to the invention not only can improve over the prior art technique, but also include the foregoing substantial advantages that are deemed highly valuable for the industry.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A hard drive connecting device for a notebook computer, which is adapted to install inside of a case of the notebook computer for connecting a main board and a hard drive in a hard drive bay of the case, the hard drive connecting device comprising:
   a flexible board having at least a first side, at least a second side, conductive lines for electrically connecting the first side with the second side, and a positioning portion for being at least partially positioned inside of the case, the positioning portion comprising a plurality of positioning openings;
   a first connector located in the hard drive bay electrically connected to the first side for electrically connecting the hard drive; and
   a second connector electrically connected to the second side for electrically connecting the main board.

2. The hard drive connecting device of claim 1, wherein the flexible board is a flexible printed circuit (FPC).

3. The hard drive connecting device of claim 1, wherein the first side and the second side are respectively two sides of the flexible board adjacent to each other.

4. The hard drive connecting device of claim 1, wherein the flexible board includes an extension located between said first side and said second side for allowing a portion of the first side and the first connector to be overturned to the exterior of the hard drive bay.

5. The hard drive connecting device of claim 1, wherein the positioning portion comprises two positioning openings.

6. The hard drive connecting device of claim 1, wherein the first connector is a hard drive connector.

7. The hard drive connecting device of claim 1, wherein the second connector is a bus connector.

8. A hard drive connecting device for a notebook computer, which is adapted to install inside of a case of the notebook computer for connecting a main board and a hard drive in a hard drive bay of the case, the case being provided with a lid body for enclosing the hard drive bay, the hard drive connecting device comprising:
   a flexible board having at least a first side, at least a second side, conductive lines for electrically connecting the first side with the second side, and a positioning portion for being at least partially positioned inside of the case, the positioning portion comprising a plurality of positioning openings;
   a first connector located in the hard drive bay electrically connected to the first side for electrically connecting the hard drive; and
   a second connector electrically connected to the second side for electrically connecting the main board.

9. The hard drive connecting device of claim 8, wherein the flexible board is a flexible printed circuit (FPC).

10. The hard drive connecting device of claim 8, wherein the first side and the second side are respectively two sides of the flexible board adjacent to each other.

11. The hard drive connecting device of claim 8, wherein the flexible board includes an extension located between said first side and said second side for allowing a portion of the first and the first connector to be overturned to the exterior of the hard drive bay.

12. The hard drive connecting device of claim 8, wherein the positioning portion comprises two positioning openings.

13. The hard drive connecting device of claim 8, wherein the first connector is a hard drive connector.

14. The hard drive connecting device of claim 8, wherein the second connector is a bus connector.

15. A hard drive connecting device for a notebook computer, which is adapted to install inside of a case of the notebook computer for connecting a main board and a hard drive in a hard drive bay of the case, the exterior of the hard drive being covered by a protective body, the hard drive connecting device comprising:
 a flexible board having at least a first side, at least a second side, conductive lines for electrically connecting the first side with the second side, and a positioning portion for being at least partially positioned inside of the case, the positioning portion comprising a plurality of positioning openings;
 a first connector located in the hard drive bay electrically connected to the first side for electrically connecting the hard drive; and
 a second connector electrically connected to the second side for electrically connecting the main board.

16. The hard drive connecting device of claim 15, wherein the flexible board is a flexible printed circuit (FPC).

17. The hard drive connecting device of claim 15, wherein the first side and the second side are respectively two sides of the flexible board adjacent to each other.

18. The hard drive connecting device of claim 15, wherein the flexible board includes an extension located between said first side and said second side for allowing a portion of the first side and the first connector to be overturned to the exterior of the hard drive bay.

* * * * *